US007361982B2

(12) United States Patent
Hsu

(10) Patent No.: US 7,361,982 B2
(45) Date of Patent: Apr. 22, 2008

(54) BUMPLESS CHIP PACKAGE

(75) Inventor: Chi-Hsing Hsu, Taipei Hsien (TW)

(73) Assignee: VIA Technologies, Inc., Taipei Hsien (TW)

( * ) Notice: Subject to any disclaimer, the term of this patent is extended or adjusted under 35 U.S.C. 154(b) by 283 days.

(21) Appl. No.: 11/314,787

(22) Filed: Dec. 19, 2005

(65) Prior Publication Data

US 2007/0040259 A1 Feb. 22, 2007

(30) Foreign Application Priority Data

Aug. 17, 2005 (TW) .............................. 94127993 A

(51) Int. Cl.
*H01L 23/34* (2006.01)

(52) U.S. Cl. ....................................... 257/686; 257/723

(58) Field of Classification Search ................ 257/686, 257/723, 778

See application file for complete search history.

(56) References Cited

U.S. PATENT DOCUMENTS 5,048,179 A * 9/1991 Shindo et al. ................ 29/840
6,555,906 B2 * 4/2003 Towle et al. ................ 257/723
7,074,696 B1 * 7/2006 Frankowsky et al. ....... 438/464

* cited by examiner

*Primary Examiner*—Roy Potter
(74) *Attorney, Agent, or Firm*—J.C. Patents

(57) ABSTRACT

A bumpless chip package including at least a panel-shaped component, a chip, an interconnection structure and a conductive channel is provided. The chip is disposed on the panel-shaped component. The chip has a plurality of chip pads disposed on an active surface of the chip. The interconnection structure is disposed on the panel-shaped component and the chip. The interconnection structure has an inner circuit and a plurality of contact pads. The contact pads are disposed on a contact surface of the interconnection structure. At lease one chip pad is connected electrically to at least one contact pad by the inner circuit. The conductive channel extends from the active surface of the chip to a side surface thereof adjacent to the active surface. One end of the conductive channel is electrically connected to at least one chip pad and the other end thereof is electrically connected to the panel-shaped component.

20 Claims, 7 Drawing Sheets

BUMPLESS CHIP PACKAGE

CROSS-REFERENCE TO RELATED APPLICATION

This application claims the priority benefit of Taiwan application serial no. 94127993, filed on Aug. 17, 2005. All disclosure of the Taiwan application is incorporated herein by reference.

BACKGROUND OF THE INVENTION

1. Field of Invention

The present invention relates to a bumpless chip package. More particularly, the present invention relates to a bumpless chip package having a conductive channel to shorten the transmission path between the chip and the panel-shaped component and to prevent the edge of the chip from cracking due to high operational temperature.

2. Description of Related Art

With rapid advancement of electronic technology, the chip package technology is developing towards miniature size and high density to meet various requirements such as high processing speed, multifunction, high integration, light weight, and low cost in the electronic devices. Generally, in the conventional ball grid array (BGA) package technology, the package substrate is applied as the carrier of IC chips, and electrical connection technology such as flip chip bonding or wire bonding technology is applied to electrically connect the chip to the top surface of the package substrate, and a plurality of solder balls are disposed on the bottom surface of the package substrate in area array. Accordingly, the chip may be electrically connected to the electronic apparatus in the next level, e.g. printed circuit board etc, through the inner circuit of the package substrate and the solder balls at the bottom of the package substrate.

However, in the conventional BGA package technology, the package substrate of high layout density combined with electrical connection technology such as flip chip bonding or wire bonding results in a long signal transmission path. Thus, a bumpless build-up layer (BBUL) chip package technology has been developed, wherein the process of flip chip bonding or wire bonding for connecting the chip to the package substrate is skipped, but a multi-layered interconnection structure is fabricated on the chip, and electrical contacts such as solder balls or pins are fabricated on the multi-layered interconnection structure in area array to electrically connect to the electronic apparatus of the next level.

Referring to FIG. 1, a cross-sectional view of a conventional bumpless chip package is shown. The conventional bumpless chip package 100 includes a chip 110, an interconnection structure 120, a panel-shaped component 130, and a plurality of solder balls 140. The chip 110 is disposed on the panel-shaped component 130, and the panel-shaped component 130 is used as a base plate or a support layer. The chip 110 has a plurality of point-shape pads 112 arranged in area array and disposed on an active surface 114 of the chip 110. In addition, the point-shape pads 112 include signal pads, ground pads, and power pads, etc.

Moreover, the interconnection structure 120 is also disposed on the panel-shaped component 130, wherein the interconnection structure 120 is formed on the panel-shaped component 130 in a build-up process. The interconnection structure 120 has an inner circuit 122 and a plurality of contact pads 124 disposed on a contact surface 126 of the interconnection structure 120. Note that the point-shape pads 112 and the contact pads 124 are electrically connected through the inner circuit 122.

In addition, the interconnection structure 120 includes a plurality of dielectric layers 128, a plurality of conductive vias 122*a*, and a plurality of circuit layers 122*b*. The conductive vias 122*a* and the circuit layers 122*b* form the aforementioned inner circuit 122. The dielectric layers 128 and the circuit layers 122*b* are staggered, and the conductive vias 122*a* pass through the dielectric layers 128 respectively. Two circuit layers 122*b* are electrically connected to each other through at least a conductive via 122*a*. In addition, the solder balls 140 are disposed on the contact pads 124 to electrically connect to the electronic apparatus of the next level (not shown).

However, the edge of the chip will easily crack due to the high temperature produced during operation and the difference of coefficient of thermal expansion (CTE) between the chip and the panel-shaped component, thus causing damage to the integrated circuit on the active surface of the chip, and the proper operation of the chip will be adversely affected.

SUMMARY OF THE INVENTION

One example of the present invention provides a bumpless chip package including at least a panel-shaped component, at least a chip, an interconnection structure, and at least one conductive channel. The chip is disposed on the panel-shaped component. The chip has a plurality of chip pads disposed on an active surface of the chip. In addition, the interconnection structure is disposed on the panel-shaped component and the chip, and the interconnection structure has an inner circuit and a plurality of contact pads disposed on a contact surface of the interconnection structure, and at lease one of the chip pads is connected electrically to at least one of the contact pads through the inner circuit. Furthermore, the conductive channel is disposed on the active surface of the chip and extends from the active surface to at least one side surface thereof adjacent to the active surface. One end of the conductive channel is electrically connected to at least one of the chip pads and the other end of the conductive channel is electrically connected to the panel-shaped component.

In order to make the aforementioned features and advantages of the present invention comprehensible, embodiments accompanied with figures is described in detail below.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
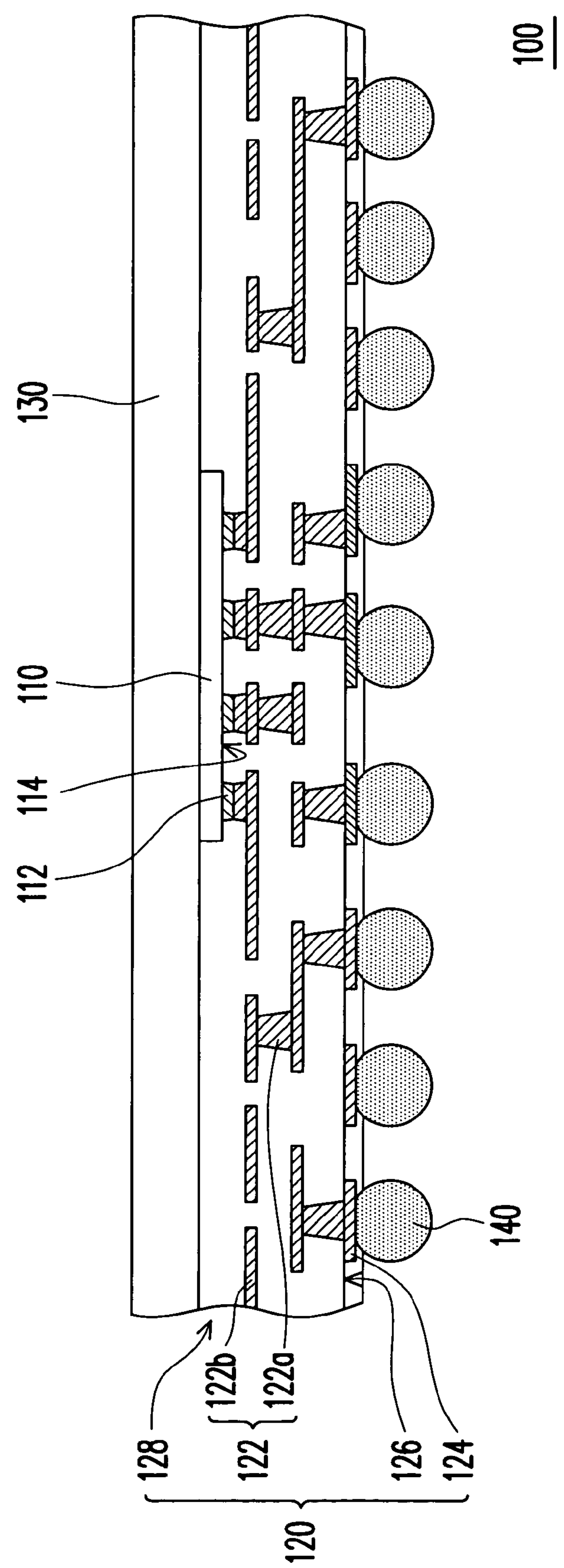
FIG. 1 is a cross-sectional view of a conventional bumpless chip package.
Figure 2:
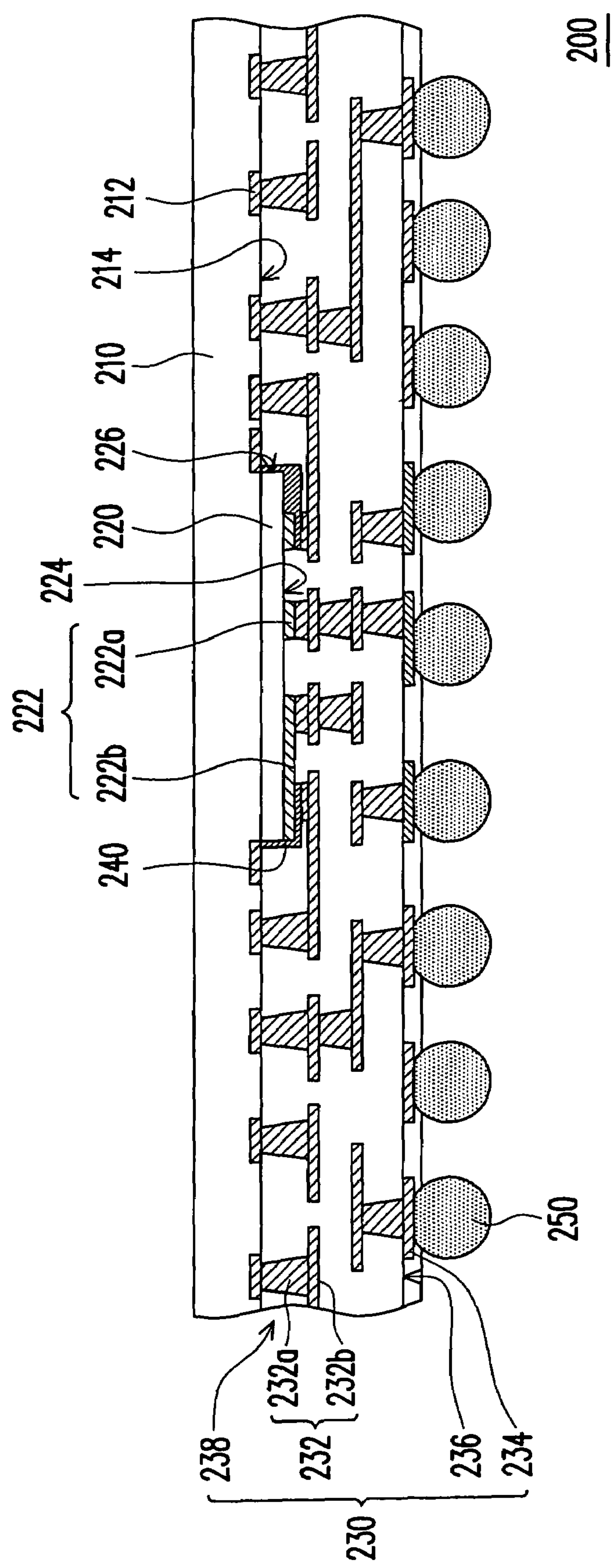
FIG. 2 is a cross-sectional view of a bumpless chip package according to the first embodiment of the present invention.

Referring to FIG. 2, a cross-sectional view of a bumpless chip package according to the first embodiment of the present invention is shown. The bumpless chip package 200 of the present embodiment includes at least one panel-shaped component 210 (one is shown in the figure), at least one chip 220 (one is shown in the figure), an interconnection structure 230, and at least one conductive channel 240. The chip 220 is disposed on the panel-shaped component 210. The panel-shaped component 210 can be viewed as a carrier of the chip 220, and the chip 220 has a plurality of chip pads 222 disposed on an active surface 224 of the chip 220.

In addition, the interconnection structure 230 is disposed on the panel-shaped component 210 and the chip 220, wherein the interconnection structure 230 may be formed on the panel-shaped component 210 by a build-up process. The interconnection structure 230 has an inner circuit 232 and a plurality of contact pads 234 disposed on a contact surface 236 of the interconnection structure 230, and at least one of the chip pads 222 is electrically connected to at least one of the contact pads 234 through the aforementioned inner circuit 232.

Furthermore, the conductive channel 240 extends from the active surface 224 of the chip 220 to at least one side surface 226 adjacent to the active surface 224. One end of the conductive channel 240 is electrically connected to at least one of the chip pads 222 and the other end of the conductive channel 240 is electrically connected to the panel-shaped component 210. The conductive channel 240 is formed by an electroplating process, and the material thereof may be copper. One function of the conductive channel 240 is to shorten the transmission path between the chip 220 and the panel-shaped component 210. Another function of the conductive channel 240 is to prevent the edge of the chip from cracking due to the difference of CTEs between the chip 220 and the panel-shaped component 210 under high operational temperature, which could further affect the proper operation of the chip 220.

Figure 3:
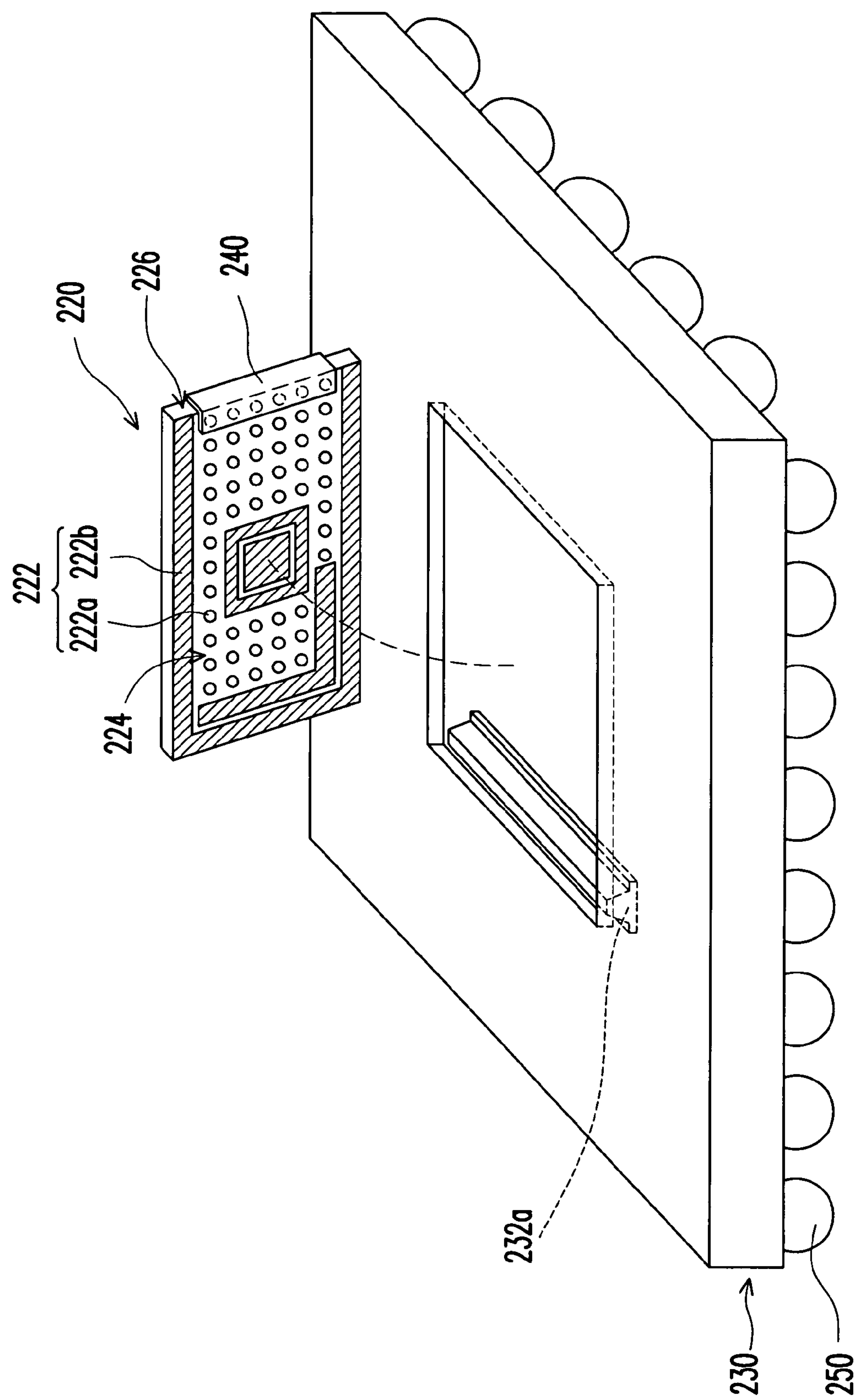
FIG. 3 is an exploded diagram of the chip and the interconnection structure in FIG. 2.
Figure 4B:
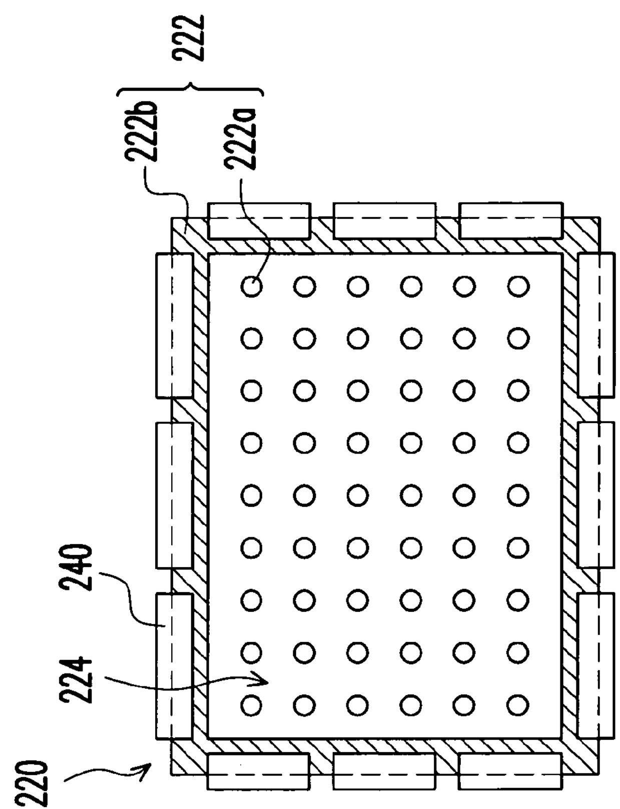
FIG. 4A to 4D are diagrams illustrating different shapes and arrangements of the chip pads and conductive channel in FIG. 2.
Figure 4A:
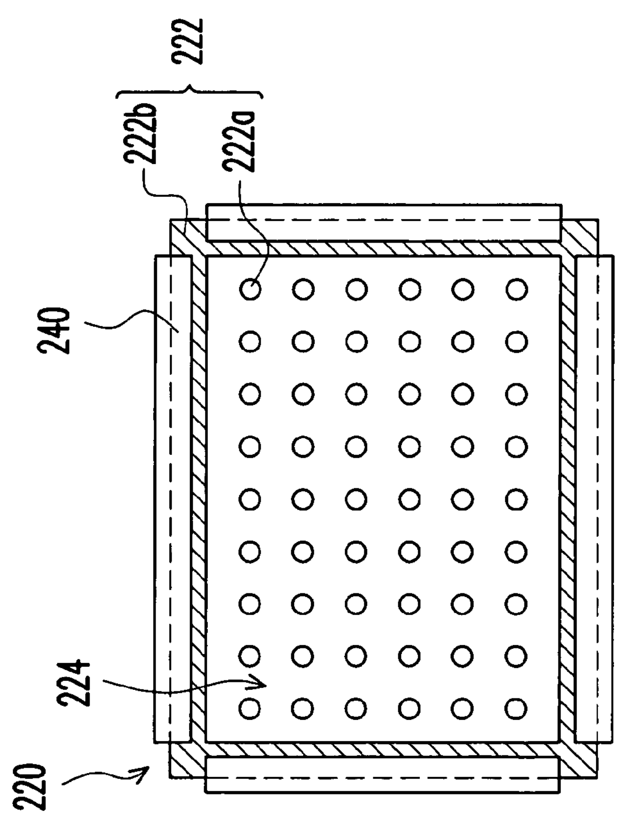
Figure 4D:
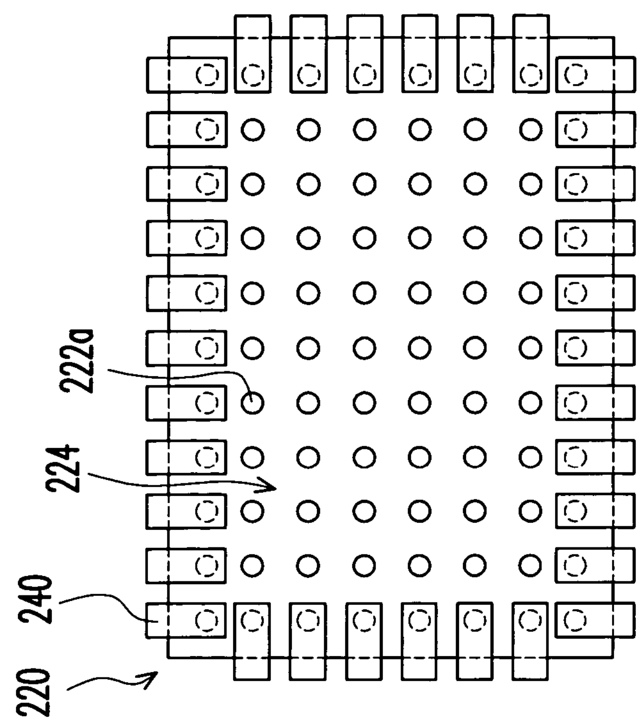
Figure 4C:
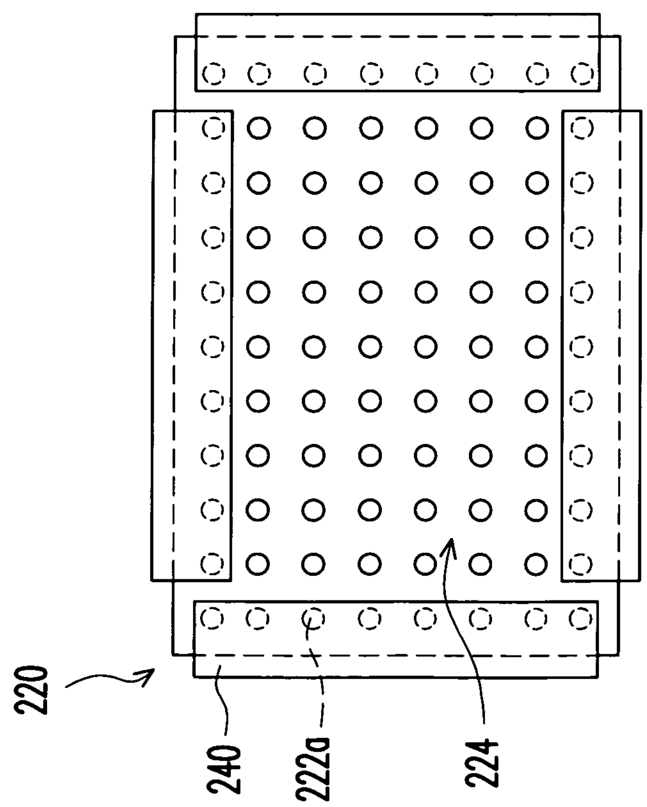

Referring to FIG. 3, an exploded diagram of the chip and the interconnection structure in FIG. 2 is shown. For a simple description, FIG. 3 only illustrates the conductive channel 240 located at one edge of the chip 220. In fact, in the present embodiment, at least a conductive channel 240 is disposed at each edge of the active surface 224. It can be seen from FIG. 3 that the chip pads 222 include a plurality of point-shape pads 222*a* and at least one non-point-shape pad 222*b*, and the surface area of the non-point-shape pad 222*b* is greater than or equal to the sum of the surface areas of two point-shape pads 222*a*. In other words, a non-point-shape pad 222*b* can be formed by combining at least two adjacent point-shape pads 222*a*.

However, referring to FIGS. 4A to 4D, diagrams illustrating different shapes and arrangements of the chip pads and conductive channel in FIG. 2, it can be seen that, the shape and arrangement of the conductive channel 240 may have various forms and variations based on the design requirements as long as the aforementioned functions are not affected. The periphery of the active surface 224 of the chip 220 may be non-point-shape pads 222*b* (refer to FIGS. 4A and 4B) or point-shape pads 222*a* (refer to FIGS. 4C and 4D), and one edge of the active surface 224 may be disposed with one conductive channel 240 (refer to FIGS. 4A and 4C) or a plurality of conductive channels 240 (refer to FIGS. 4B and 4D). It has to be understood that the chip pads 222 may also be all point-shape pads 222*a* in shape. As described above, FIGS. 4A to 4D are only examples of the present embodiment but are not intended to restrict the scope of the present invention.

Referring to FIGS. 2 and 3, the interconnection structure 220 may include a plurality of dielectric layers 238, a plurality of channel vias 232*a*, and a plurality of circuit layers 232*b*. The conductive vias 232*a* pass through the dielectric layers 238 respectively, wherein one end of at least one of the conductive vias 232*a* is electrically connected to the non-point-shape pad 222*b*. The circuit layers 232*b* and the dielectric layers 238 are stacked each other, and the circuit layers 232*b* and the conductive vias 232*a* form the aforementioned inner circuit 232, and two circuit layers 232*b* are electrically connected through at least one of the conductive vias 232*a*.

Referring to FIG. 3, the conductive via 232*a* electrically connected to the non-point-shape pad 222*b* is on a projection plane parallel to the active surface 224. The projection of the partial extending path of the conductive via 232*a* may overlap with that of the non-point-shape pad 222*b* electrically connected thereto on the projecting plane. In other words, the shape of the conductive via 232*a* electrically connected to the non-point-shape pad 222*b* may be a slot (only one piece is shown in FIG. 3 as an example).

Furthermore, at least one of the point-shape pads 222*a* may be a signal pad, and the non-point-shape pad 222*b* may be a non-signal pad (ground pad, power pad, or other types of non-signal pad) if differentiated by function. The non-point-shape pad 222*b* may be an annular pad, strip pad, or block pad if differentiated by shape, as shown in FIG. 3. In other words, the arrangement of chip pads 222 may vary by the quantity or location of point-shape pads 222*a* and non-point-shape pads 222*b*, or by the shape of non-point-shape pads 222*b*. For example, it may be the combination of any one or several of the aforementioned shapes of the non-point-shape pads 222*b*.

Referring to FIG. 2, the contact pads 234 may be applied on signal input/output interface of land grid array (LGA) type in the case that the electric contacts 250 are not disposed respectively on the contact pads 234. In addition, the electric contacts 250 may also be disposed on the pads 234 respectively, and the electric contacts 250 in the present embodiment are conductive balls to provide the signal input/output interface of ball grid array (BGA) type. Furthermore, the electric contacts 250 may also be conductive pins to provide the signal input/output interface of pin grid array type (not shown in the figure). Moreover, the contact pads 234 may be the same patterned dielectric layer because the fabrication process thereof is the same as the circuit layers 232*b*. Thus, the dielectric layer formed by the contact pads 234 may be viewed as one of the circuit layers 232*b*.

Referring to FIG. 2, the panel-shaped component 210 may have a plurality of electrodes 212 disposed on an electrode surface 214 thereof. As described in FIG. 2, the conductive channel 240 may be connected to at least one of the electrodes 212. In addition, at least one of the chip pads 222 of the chip 220 may be electrically connected to at least one of the electrodes 212 through the inner circuit 232 of the interconnection structure 230. Moreover, at least one of the electrodes 212 may be electrically connected to at least one of the contact pads 234 of the interconnection structure 230 through the inner circuit 232.

In the present embodiment, the panel-shaped component 210 may be a panel-shaped active component or a panel-shaped passive component, wherein the panel-shaped active component may be a panel-shaped transistor component, and the panel-shaped passive component may be a panel-shaped capacitor component, panel-shaped resistor component, or panel-shaped inductance component, etc. Note that, the panel-shaped component 210 may have an active component part and a passive component part to be an integrated panel-shaped component. In addition, since the panel-shaped component 210 may be fabricated in a semiconductor manufacturing process or a ceramic sintering process, the material of the panel-shaped component 210 may be silicon or ceramic, etc.

Figure 5:
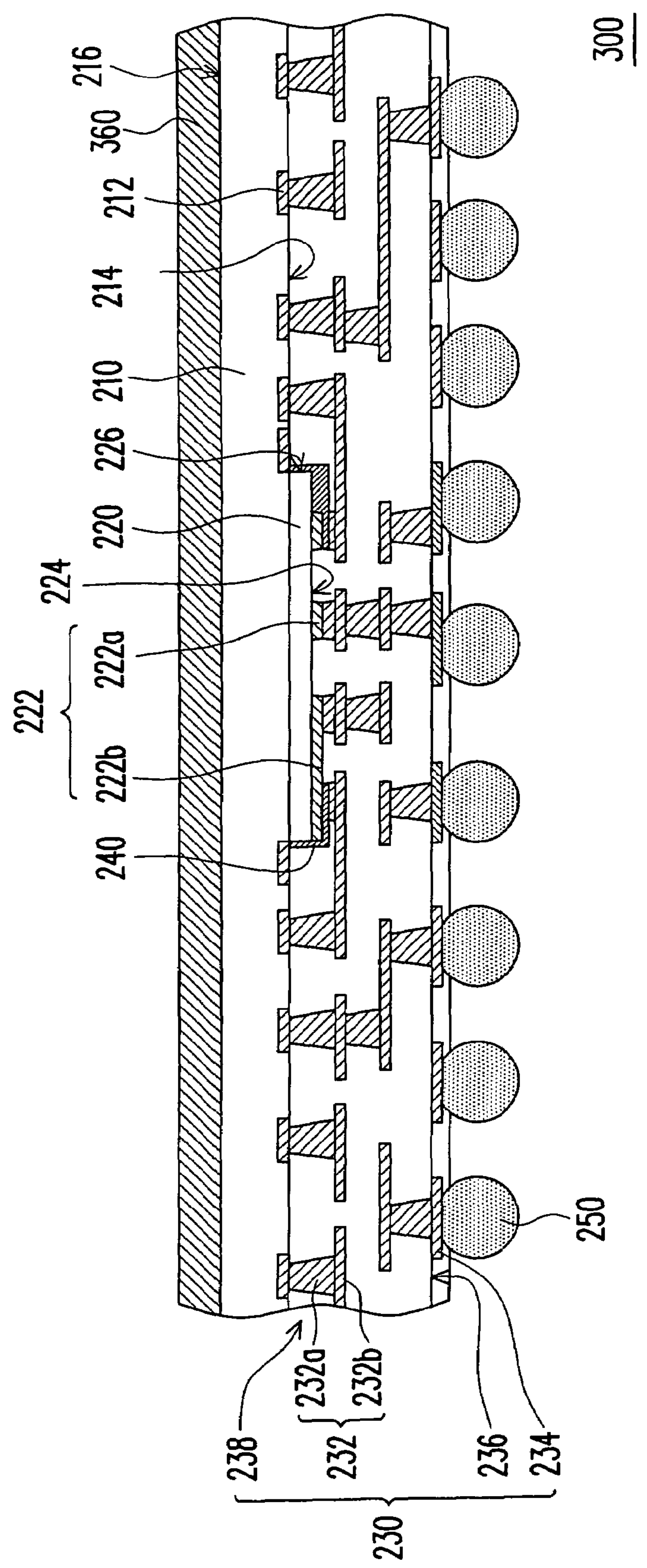
FIG. 5 is a cross-sectional view of a bumpless chip package according to the second embodiment of the present invention.

Referring to FIG. 5, a cross-sectional view of a bumpless chip package according to the second embodiment of the present invention is shown. Unlike the first embodiment, the bumpless chip package 300 in the present embodiment further includes a heat spreader 360 disposed on a non-electrode surface 216 (or a surface) of the panel-shaped component 210 away from the chip 220 to efficiently transmit the heat produced by the chip 220 to the surface of the heat spreader 360.

Figure 6:
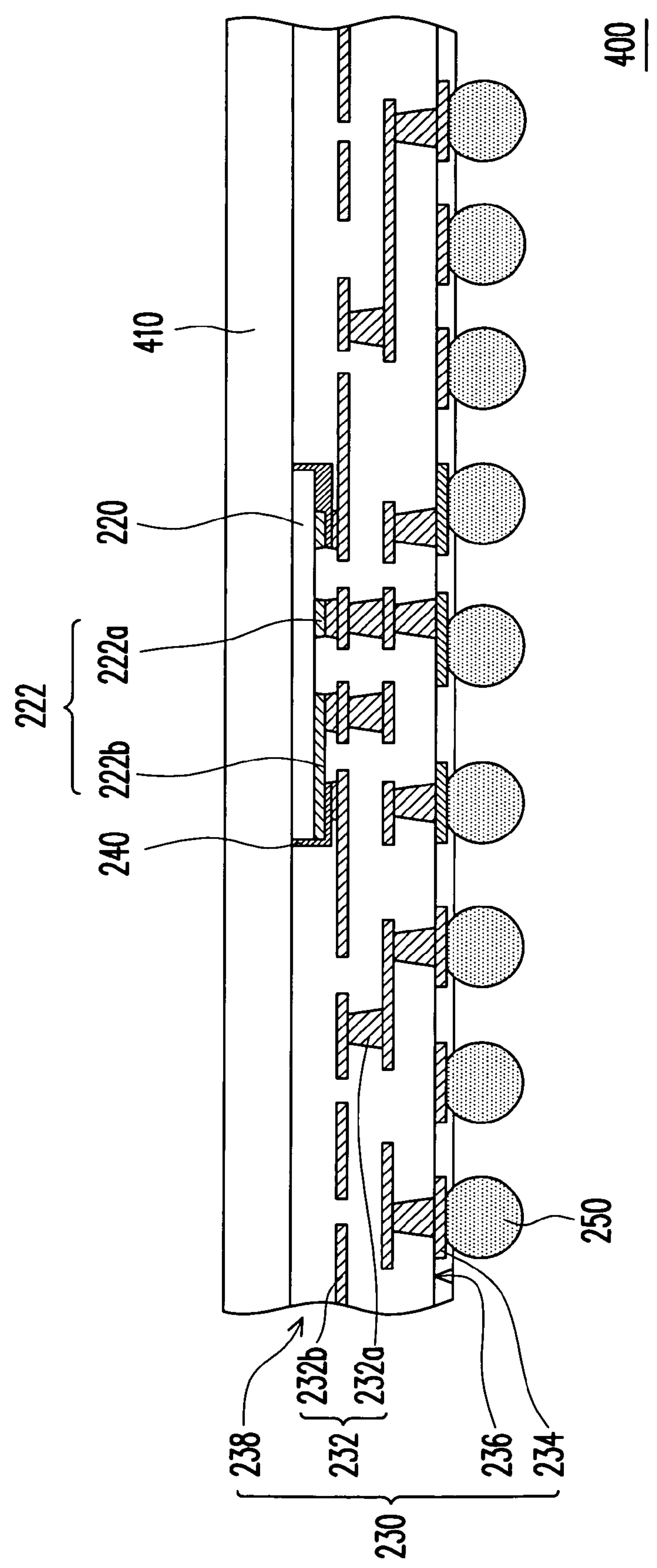
FIG. 6 is a cross-sectional view of a bumpless chip package according to the third embodiment of the present invention.

Referring to FIG. 6, a cross-sectional view of a bumpless chip package according to the third embodiment of the present invention is shown. Unlike the first and the second embodiment, the panel-shaped component 410 of the bumpless chip package 400 in the present embodiment is a heat spreader and the material of the panel-shaped component 410 may be metal, to efficiently transmit the heat produced by the chip 220 to the surface of the panel-shaped component 410.

In summary, the present invention has at least the following advantages:

a) The present invention may shorten the transmission path between the chip and the panel-shaped component and accordingly may increase the electric efficiency of the chip package by disposing the conductive channel between the edge of the chip and the panel-shaped component;

b) In the conventional bumpless chip package, the edge of the chip may crack and the operation thereof may be affected because of the high temperature produced during the chip operation and the difference of CTEs between the chip and the panel-shaped component. In comparison, in the present invention, the conductive channel is disposed between the edge of the chip and the panel-shaped component to prevent the edge of the chip from cracking due to different CTEs between the chip and the panel-shaped component, and to maintain the proper operation of the chip and extend the life span of the chip.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A bumpless chip package, comprising:

at least a panel-shaped component;

at least a chip disposed on the panel-shaped component, the chip having a plurality of chip pads disposed on an active surface of the chip;

an interconnection structure disposed on the panel-shaped component and the chip, the interconnection structure having an inner circuit and a plurality of contact pads disposed on a contact surface away from the chip, and at least one of the chip pads being electrically connected to at least one of the contact pads through the inner circuit; and at least a conductive channel extending from the active surface of the chip to at least one side surface adjacent to the active surface, and one end of the conductive channel being electrically connected to at least one of the chip pads and the other end of the conductive channel being electrically connected to the panel-shaped component.

2. The bumpless chip package of claim 1, wherein the interconnection structure comprises:

a plurality of dielectric layers;

a plurality of conductive vias, and each of the conductive vias passing through at least one of the dielectric layers, wherein one end of at least one of the conductive vias is electrically connected to at least one of the chip pads; and a plurality of circuit layers stacked with the dielectric layers alternately to form the inner circuit, and two of the circuit layers being electrically connected through at least one of the conductive vias.

3. The bumpless chip package of claim 1, wherein the chip pads are point-shape pads.

4. The bumpless chip package of claim 1, wherein the chip pads include a plurality of point-shape pads and at least one non-point-shape pad, and the surface area of the non-point-shape pad is greater than or equal to the sum of the surface area of two point-shape pads.

5. The bumpless chip package of claim 4, wherein the interconnection structure includes:

a plurality of dielectric layers;

a plurality of conductive vias, and each of the conductive vias passing through at least one of the dielectric layers, wherein one end of at least one of the conductive vias is electrically connected to the non-point-shape pad; and a plurality of circuit layers stacked with the dielectric layers alternately, forming the inner circuit along with the conductive vias, and two circuit layers being electrically connected through at least one of the conductive vias.

6. The bumpless chip package of claim 5, wherein a projection of the partial extending path of the conductive via, electrically connected to the non-point-shape pad, on a projection plane parallel to the active surface overlaps with that of the non-point-shape pad, electrically connected to the conductive via, on the projection plane.

7. The bumpless chip package of claim 6, wherein the conductive via is a conductive slot.

8. The bumpless chip package of claim 4, wherein at least one of the point-shape pads is a signal pad.

9. The bumpless chip package of claim 4, wherein the non-point-shape pad is a non-signal pad.

10. The bumpless chip package of claim 4, wherein the non-point-shape pad is a ground pad or a power pad.

11. The bumpless chip package of claim 4, wherein the non-point-shape pad is an annular pad, a strip pad, or a block pad.

12. The bumpless chip package of claim 1, wherein the panel-shaped component has a plurality of electrodes disposed on an electrode surface of the panel-shaped component, and the chip is disposed on the electrode surface of the panel-shaped component.

13. The bumpless chip package of claim 12, wherein the conductive channel is connected to at least one of the electrodes.

14. The bumpless chip package of claim 12, wherein at least one of the electrodes is electrically connected to at least one of the chip pads through the inner circuit.

15. The bumpless chip package of claim 12, wherein at least one of the electrodes is electrically connected to at least one of the contact pads through the inner circuit.

16. The bumpless chip package of claim 12, further including a heat spreader disposed on a non-electrode surface of the panel-shaped component away from the chip.

17. The bumpless chip package of claim 12, wherein the panel-shaped component is a panel-shaped active component, a panel-shaped passive component, or a panel-shaped component having an active component part and a passive component part.

18. The bumpless chip package of claim 12, wherein a material of the panel-shaped component includes silicon or ceramic.

19. The bumpless chip package of claim 1, wherein the panel-shaped component is a heat spreader.

20. The bumpless chip package of claim 1, further including a plurality of electric contacts disposed on the contact pads.

* * * * *